(12) United States Patent
Kim et al.

(10) Patent No.: US 12,058,896 B2
(45) Date of Patent: Aug. 6, 2024

(54) DISPLAY PANEL AND DISPLAY DEVICE INCLUDING THE SAME

(71) Applicant: LG Display Co., Ltd., Seoul (KR)

(72) Inventors: Yongmin Kim, Anyang-si (KR); Jaeyoung Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/989,482

(22) Filed: Nov. 17, 2022

(65) Prior Publication Data
US 2023/0157085 A1    May 18, 2023

(30) Foreign Application Priority Data
Nov. 18, 2021  (KR) .......................... 10-2021-0159755

(51) Int. Cl.
*G09G 3/3208* (2016.01)
*H10K 50/86* (2023.01)
*H10K 59/122* (2023.01)
*H10K 59/35* (2023.01)

(52) U.S. Cl.
CPC ......... *H10K 59/122* (2023.02); *G09G 3/3208* (2013.01); *H10K 50/865* (2023.02); *G09G 2300/0426* (2013.01); *G09G 2300/0842* (2013.01); *G09G 2320/0233* (2013.01); *H10K 59/351* (2023.02)

(58) Field of Classification Search
CPC .. G09G 3/3208; H10K 59/122; H10K 50/865; H10K 59/351
See application file for complete search history.

(56) References Cited

U.S. PATENT DOCUMENTS

| | | | |
|---|---|---|---|
| 10,847,749 B2 | 11/2020 | Lee | |
| 11,723,255 B2* | 8/2023 | Hong | H10K 59/65 345/156 |
| 2015/0185549 A1* | 7/2015 | Jeon | G02F 1/133512 349/110 |
| 2019/0206328 A1* | 7/2019 | Park | G09G 3/3291 |
| 2020/0152906 A1* | 5/2020 | Kirita | H10K 71/00 |
| 2021/0280659 A1* | 9/2021 | Park | H01L 27/1225 |
| 2022/0130915 A1* | 4/2022 | Son | H10K 59/65 |

FOREIGN PATENT DOCUMENTS

KR    10-2020-0075379 A    6/2020

* cited by examiner

*Primary Examiner* — Kevin M Nguyen
(74) *Attorney, Agent, or Firm* — Birch, Stewart, Kolasch & Birch, LLP

(57) ABSTRACT

A display panel includes a display area composed of a light-emitting area and a light-transmissive area in which a dark spot defect in the light-transmissive area does not occur. Further, in the display panel, a decrease in transmittance due to light leakage can be prevented, and color mixing between adjacent pixels can be prevented. To this end, a metal layer is disposed at a boundary between the light-emitting area and the light-transmissive area, a metal layer is disposed at a boundary between sub-pixels rendering different colors and adjacent to each other, and a metal layer is disposed at a boundary between two adjacent light-transmissive areas.

19 Claims, 13 Drawing Sheets

DISPLAY PANEL AND DISPLAY DEVICE INCLUDING THE SAME

CROSS-REFERENCE TO RELATED APPLICATION

This application claims a priority benefit under 35 U.S.C. § 119(a) to Korean Patent Application No. 10-2021-0159755 filed on Nov. 18, 2021, in the Korean Intellectual Property Office, the entire contents of which are hereby expressly incorporated by reference into the present application.

BACKGROUND

Field

The present disclosure relates to a display panel in which in a large-area display having a display area composed of a light-emitting area and a light-transmissive area, a dark spot defect in the light-transmissive area can be reduced, and decrease in transmittance due to light leakage can be prevented, and color mixing between adjacent pixels can be prevented. The present disclosure further relates to a display device including the display panel.

Description of Related Art

A flat panel display device (FPD) includes an organic light-emitting diode (OLED) display device which has high luminance and low operating voltage.

The OLED display device is a self-luminous type device that emits light by itself. Thus, a contrast ratio thereof is high and the device can realize an ultra-thin display. The device has a response time of several microseconds, so that it is easy to realize a moving image. There is no restriction on viewing angle of an OLED display device. The device is stable even at low temperatures. The device operates at a low voltage. Thus, it is easy to manufacture and design an operation circuit thereof.

Each pixel area of the OLED display device includes a plurality of thin-film transistors, such as a switching thin-film transistor, a driving thin-film transistor, and a sensing thin-film transistor.

SUMMARY OF THE DISCLOSURE

Recently, a transparent display device using an OLED display device has been widely developed. The transparent display device shows a look of nature through a light-transmissive area, and thus displays image information and surrounding environment information together.

Each pixel of the transparent display device using the OLED display device includes light-emitting areas to emit light of red, green, and blue colors, respectively, and selectively activates the red, green, and blue light-emitting areas to display various color images.

Each of light-emitting layers to emit light of red, green, and blue colors is formed by performing a vacuum thermal evaporation process to selectively deposit a light emitting material using a fine metal mask.

However, in a top emission type transparent display device, a cathode electrode of a pixel area can be formed by performing sputtering (SPT) deposition of indium zinc oxide (IZO).

Therefore, in the top emission type transparent display device, an amount of a foreign material as produced is 10 times greater than that in a bottom emission type display device, which may result in dark spots on a display screen.

Accordingly, in order to address the above limitations, the inventors of the present disclosure have invented a display panel of a large-area display device having a display area composed of a light-emitting area and a light-transmissive area in which a metal layer is disposed at a boundary between the light-emitting area and the light-transmissive area, thereby preventing a short circuit between anode and cathode electrodes in an organic light-emitting area as caused by a foreign material, and reducing dark spot defect in the light-transmissive area.

Further, the inventors of the present disclosure have invented a display device in which a metal layer is disposed at a boundary between a light-emitting area and a light-transmissive area of a display area, and a metal layer is disposed at a boundary between sub-pixels rendering different colors and adjacent to each other, and a metal layer is disposed at a boundary between two adjacent light-transmissive areas, thereby preventing or minimizing decrease in transmittance due to light leakage and preventing mixing between colors of adjacent pixels.

Purposes according to the present disclosure are not limited to the above-mentioned purpose. Other purposes and advantages according to the present disclosure that are not mentioned can be understood based on following descriptions, and can be more clearly understood according to embodiments according to the present disclosure. Further, it will be easily understood that the purposes and advantages according to the present disclosure can be realized using means shown in the claims and combinations thereof.

A display panel according to one embodiment of the present disclosure can be provided. In a display area of the display panel, a light-emitting area can be disposed between two light-transmissive areas. A metal layer or an alloy film can be disposed at a boundary between the light-transmissive area and the light-emitting area.

Further, a display device according to one embodiment of the present disclosure can be provided. The display device includes a display panel in which a light-emitting area is disposed between two light-transmissive areas in a display area of the display panel, and a metal layer or an alloy film is disposed at a boundary between the light-transmissive area and the light-emitting area, a data driver for applying a data signal to the display panel, a scan driver for applying a scan signal to the display panel, and a timing controller for controlling the data driver and the scan driver.

The foreign material is produced when the cathode electrode of the pixel area in the top emission type transparent display device is formed by performing sputtering (SPT) deposition of indium zinc oxide (IZO). However, according to an embodiment of the present disclosure, the metal layer made of aluminum (Al), etc. can be additionally deposition thereon and an oxide film can be formed on the foreign material under aging thereof, thereby preventing a short circuit between the anode and the cathode due to the foreign material from occurring.

Further, according to an embodiment of the present disclosure, as light leakage does not occur due to the metal layer or the alloy film disposed at the boundary between the light-transmissive area and the light-emitting area, thereby preventing mixing between colors of adjacent pixels and thus increasing color purity.

Further, according to an embodiment of the present disclosure, a metal layer or an alloy film disposed at the boundary between the light-transmissive area and the light-emitting area can reduce a separation distance between a pixel and the light-transmissive area so that a size of the light-transmissive area can be increased.

Further, according to an embodiment of the present disclosure, when a large-screen high-resolution device is produced, a light path to an adjacent pixel can be blocked by the metal layer or the alloy film disposed at the boundary between the light-transmissive area and the light-emitting area.

Further, according to an embodiment of the present disclosure, the metal layer or the alloy film with low transmittance can be applied on the cathode electrode, damage to an element caused by external light can be reduced, and an area of a black matrix (BM) can be reduced, and transmittance of a product device can be increased.

Moreover, according to an embodiment of the present disclosure, the display panel with a large area, high resolution, narrow bezel, and low power consumption and the display device including the same can be realized.

Effects of the present disclosure are not limited to the above-mentioned effects, and other effects as not mentioned will be clearly understood by those skilled in the art from following descriptions.

In addition to the above-described effects, specific effects of the present disclosure will be described together while describing specific details for carrying out the present disclosure below.

DETAILED DESCRIPTION OF THE EMBODIMENTS

Figure 1:
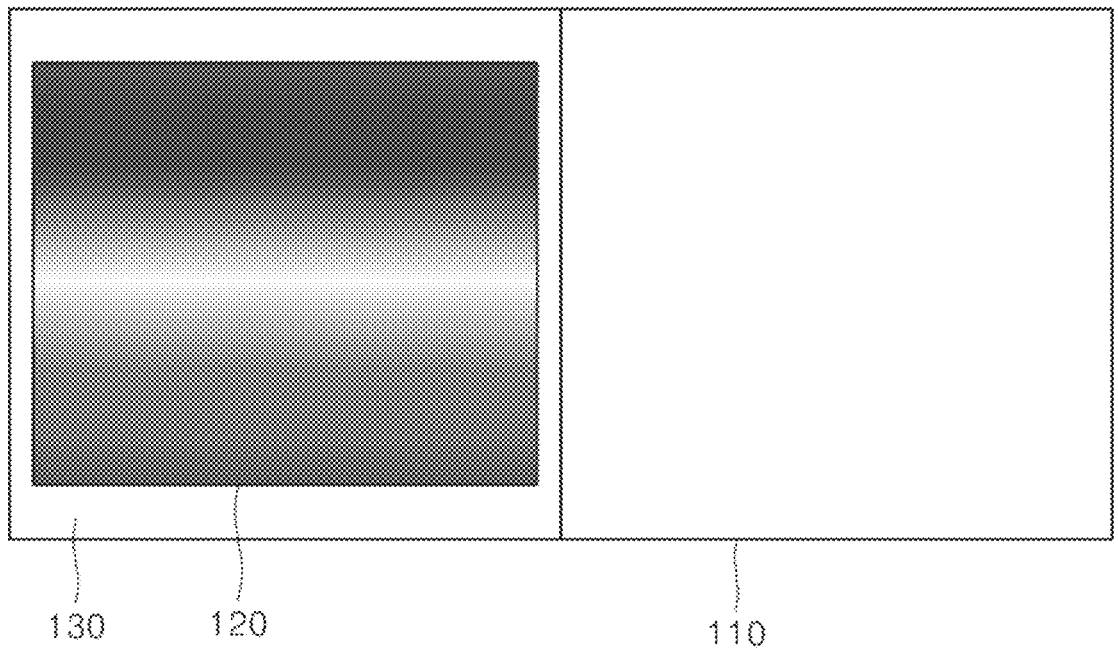
FIG. 1 is a configuration diagram schematically showing a basic configuration of a display panel according to an embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular can constitute "a" and "an" are intended to include the plural can constitute as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entirety of list of elements and may not modify the individual elements of the list. When referring to "C to D", this means C inclusive to D inclusive unless otherwise specified.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like can be disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like can be disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Spatially relative terms, such as "beneath," "below," "lower," "under," "above," "upper," and the like, can be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device can be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure can be partially or entirely combined with each other, and can be technically associated with each other or operate with each other. The embodiments can be implemented independently of each other and can be implemented together in an association relationship.

In interpreting a numerical value in the disclosure, an error range can be inherent even when there is no separate explicit description thereof.

In a description of a signal flow relationship, for example, when a signal is transmitted from a node A to a node B, the signal can be transmitted from the node A via a node C to the node B, unless an indication that the signal is transmitted directly from the node A to the node B is specified.

Hereinafter, a display panel according to an embodiment of the present disclosure and a display device including the same will be described. All components of each display device/panel according to all embodiments of the present disclosure are operatively coupled and configured.

FIG. 1 is a configuration diagram schematically showing a basic configuration of a display panel according to an embodiment of the present disclosure.

Referring to FIG. 1, a display panel 100 according to an embodiment of the present disclosure can include pixel areas. Each pixel area can include a light-transmissive area 110, a light-emitting area 120, and a metal layer 130.

For example, the present disclosure shown in FIG. 1 has a feature that the metal layer 130 is disposed at a boundary between the light-transmissive area 110 and the light-emitting area 120.

This feature can prevent a short circuit between an anode electrode and a cathode electrode in the organic light-emitting area as caused by the foreign material, and can reduce the dark spot defect in the light-transmissive area.

Hereinafter, the feature and effects according to the feature will be described in detail.

The light-transmissive area 110 can include two or more light-transmissive areas through which light transmits.

The light-emitting area 120 can include at least one light-emitting area disposed between two adjacent light-transmissive areas among the two or more light-transmissive areas.

The metal layer 130 can include at least one metal layer or at least one alloy film 130 disposed at a boundary between the light-transmissive area 110 and the light-emitting area 120 adjacent to each other.

The metal layer 130 can be made of a pure metal material such as, for example, aluminum (Al), or can be made of an alloy film including aluminum (Al).

Therefore, in an embodiment of the present disclosure, the metal layer 130 can be referred to as 'alloy film 130'.

The alloy film 130 is made of an alloy material of aluminum (Al) and titanium (Ti), or an alloy material of aluminum (Al) and molybdenum (Mo), or can be made of an alloy material of aluminum (Al) and indium zinc oxide (IZO).

At least one metal or alloy film 130 can be disposed at a boundary between two light-transmissive areas 110 adjacent to each other. The metal layer at the boundary can prevent decrease in transmittance due to light leakage.

At least one metal or alloy film 130 can be disposed at a boundary between two light-emitting areas 120 adjacent to each other. Thus, mixing between colors of adjacent pixels can be prevented by the metal layer at the boundary.

The light-emitting area 120 can include a plurality of sub-pixels rendering different colors, or a plurality of sub-pixels rendering the same color.

At least one metal or alloy film 130 can be disposed at a boundary between two sub-pixels rendering different colors, and may not be disposed at a boundary between two sub-pixels rendering the same color.

The display panel 100 can include a display area and a non-display area, and the display area can include a plurality of pixel blocks.

Each pixel block can include a plurality of sub-pixels arranged in rows and columns, wherein each sub-pixel includes a light-emitting element OLED. The plurality of sub-pixels can include, for example, at least one sub-pixel among red, green, blue, and white sub-pixels. Each pixel block can include a unit pixel area composed of at least one sub-pixel. A driving element can be disposed in each of at least one sub-pixel. GIP (Gate In Panel) elements constituting a stage can be dispersedly arranged in the unit pixel area. The GIP element can include a GIP TFT and a GIP capacitor Cst.

The light-emitting area 120 can include a plurality of sub-pixels. A plurality of sub-pixels can include a red sub-pixel, a green sub-pixel, a blue sub-pixel and a white sub-pixel.

The light-emitting area 120 can include an organic light-emitting element including an anode electrode, an organic light-emitting layer and a cathode electrode. Each of the anode electrode, the organic light-emitting layer and the cathode electrode can be made of a transparent material.

At least one light-emitting area 120 performs light-emitting operation when power is applied thereto. When the power of at least one light-emitting area 120 is turned off, natural light can transmit through two or more light-transmissive areas 110 such that a real background can be visible to a viewer.

Figure 2A:
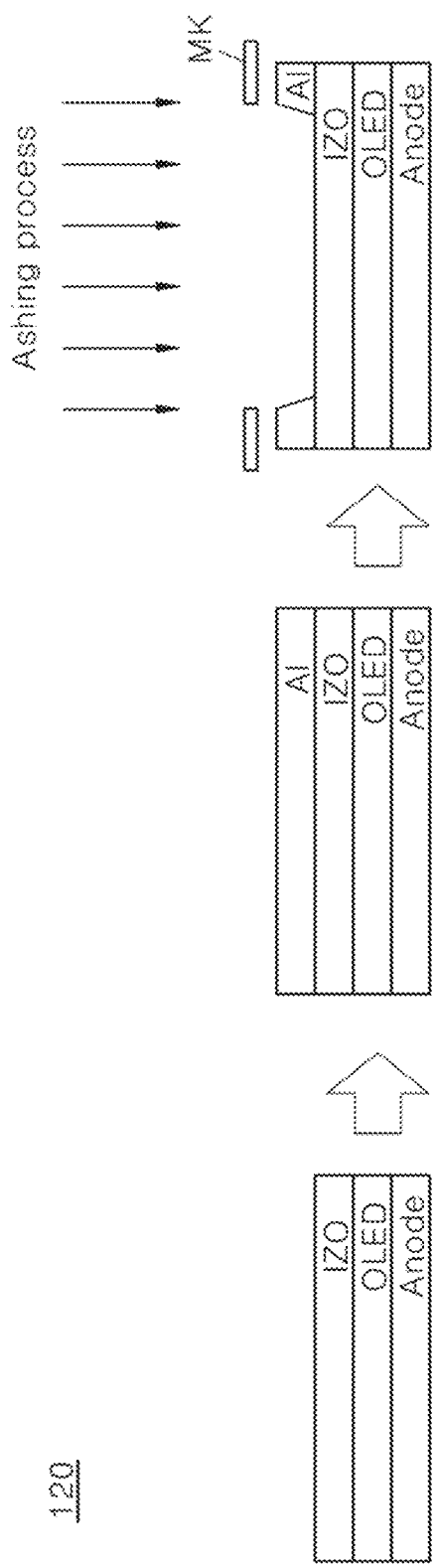
FIG. 2A is a diagram showing a process for manufacturing a light-emitting area according to an embodiment of the present disclosure.
Figure 2B:
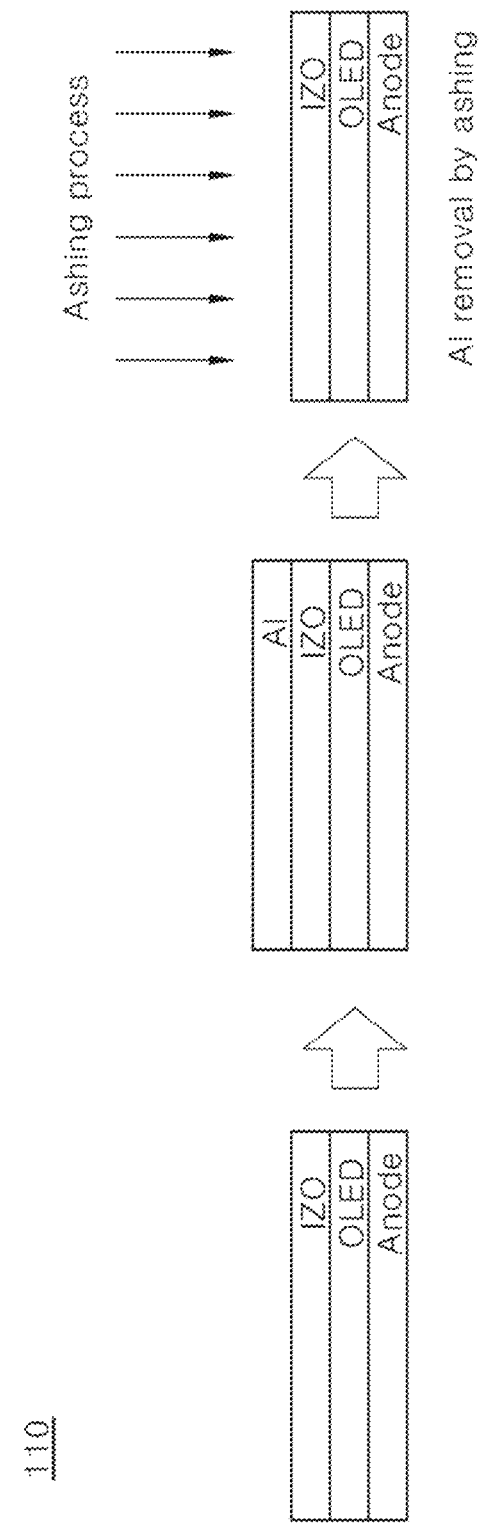
FIG. 2B is a diagram showing a process for manufacturing a light-transmissive area according to an embodiment of the present disclosure.

FIG. 2A is a diagram showing a process for manufacturing a light-emitting area according to an embodiment of the present disclosure, and FIG. 2B is a diagram showing a process for manufacturing a light-transmissive area according to an embodiment of the present disclosure.

Referring to FIG. 2A, in a light-emitting area 120 according to an embodiment of the present disclosure, an anode electrode is formed, an organic light-emitting layer OLED is formed thereon, and a cathode electrode CE made of indium zinc oxide (IZO) is formed thereon.

The anode electrode is made of indium tin oxide (ITO) or molybdenum (Mo) and the cathode electrode CE is made of indium zinc oxide (IZO).

A metal layer made of aluminum (Al) is deposited on the cathode electrode CE made of indium zinc oxide (IZO). Then, a mask MK is disposed in both edges of the light-emitting area. Then, the metal layer made of aluminum (Al) in the light-emitting area is removed via an ashing process.

Therefore, only a portion of the metal layer made of aluminum (Al) corresponding to the mask MK remains on the cathode electrode CE made of indium zinc oxide (IZO).

The portion of the metal layer made of aluminum (Al) remaining on the cathode electrode CE made of indium zinc oxide (IZO) is located at a boundary between the light-transmissive area 110 and the light-emitting area 120.

Referring to FIG. 2B, in the light-transmissive area 110 according to an embodiment of the present disclosure, an anode electrode Anode is formed, an organic light-emitting layer OLED is formed thereon, and a cathode electrode CE made of indium zinc oxide (IZO) is formed thereon.

A metal layer made of aluminum (Al) is deposited on the cathode electrode CE made of indium zinc oxide (IZO), and then an entirety of the metal layer made of aluminum (Al) is removed via an ashing process.

Therefore, any portion of the metal layer made of aluminum (Al) does not remain on the cathode electrode CE made of indium zinc oxide (IZO) and in the light-transmissive area 110.

Figure 3:
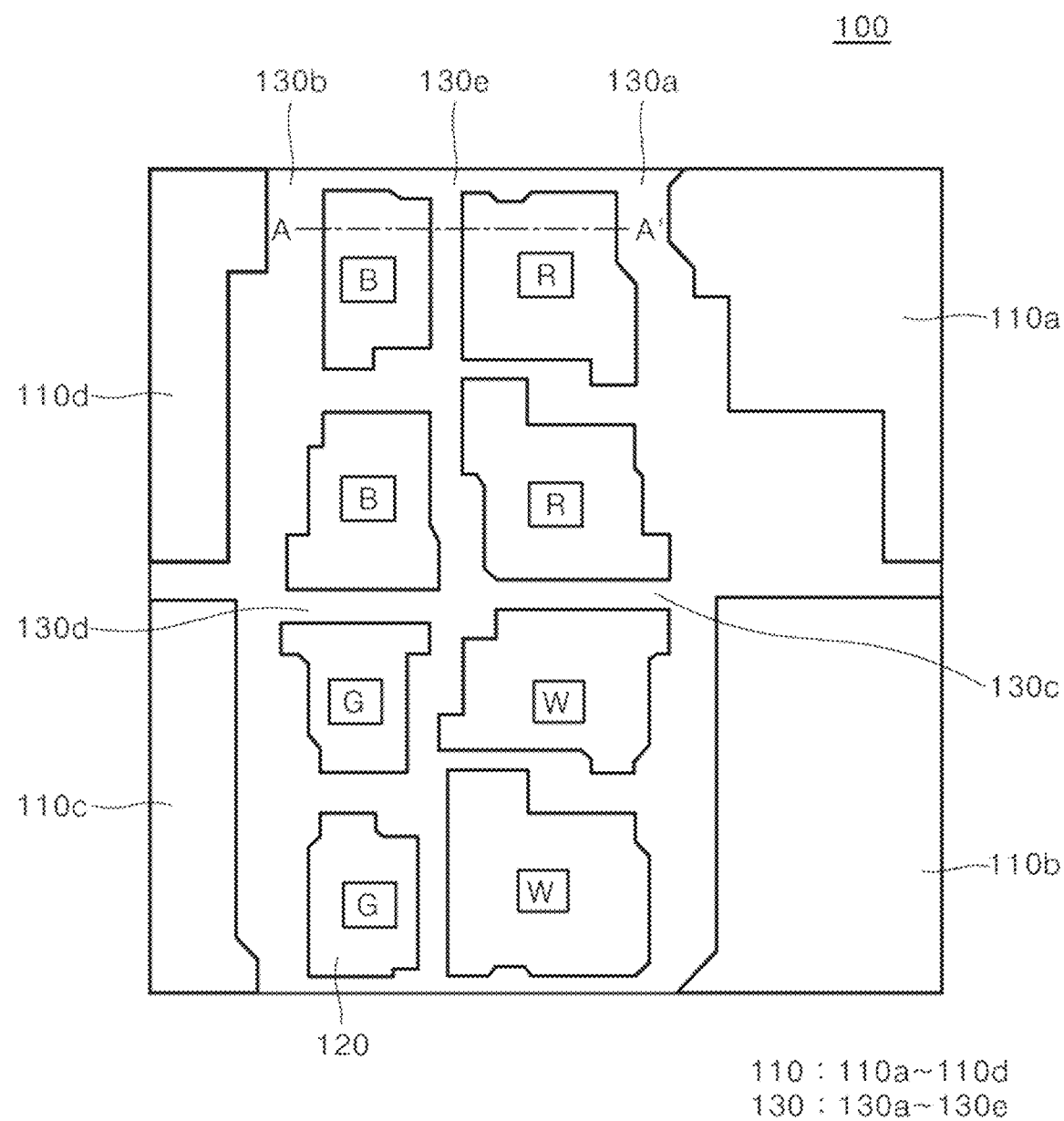
FIG. 3 is a diagram showing a plan view of a display panel according to an embodiment of the present disclosure.

FIG. 3 is a diagram showing a plan view of a display panel according to an embodiment of the present disclosure.

Referring to FIG. 3, the display panel 100 according to an embodiment of the present disclosure can include the light-transmissive area 110, the light-emitting area 120, and the metal layer 130.

The display panel 100 can include one unit pixel area, and one unit pixel area can include the light-transmissive area 110, the light-emitting area 120, and the metal layer 130.

The light-transmissive area 110 can include a plurality of light-transmissive areas 110a to 110d.

The light-emitting area 120 can include a plurality of sub-pixels R, G, B, and W.

The metal layer 130 can include a plurality of metal layers 130a to 130e.

The light-transmissive area 110 can include a first light-transmissive area 110a, a second light-transmissive area 110b, a third light-transmissive area 110c, and a fourth light-transmissive area 110d. In FIG. 3, the first light-transmissive area 110a can be disposed adjacent to an upper right side of the light-emitting area 120, and the second light-transmissive area 110b can be disposed adjacent to a lower right side of the light-emitting area 120. The third light-transmissive area 110c can be disposed adjacent to a lower left side of the light-emitting area 120, and the fourth light-transmissive area 110d can be disposed adjacent to an upper left side of the light-emitting area 120.

The light-emitting area 120 can include a plurality of red sub-pixels R, a plurality of green sub-pixels G, a plurality of blue sub-pixels B, and a plurality of white sub-pixels W. In FIG. 3, two red sub-pixels R can be arranged vertically and in an upper right portion of the light-emitting area 120, two blue sub-pixels B can be arranged vertically and in an upper left portion of the light-emitting area 120, two green sub-pixels G can be arranged vertically and in a lower left portion of the light-emitting area 120, and two white sub-pixels W can be arranged vertically and in a lower right portion of the light-emitting area 120.

The metal layer 130 can include a first metal layer 130a, a second metal layer 130b, a third metal layer 130c, a fourth metal layer 130d, and a fifth metal layer 130e.

The first metal layer 130a and the second metal layer 130b can be disposed at a boundary between the light-transmissive area 110 and the light-emitting area 120.

The first metal layer 130a can be disposed at a boundary between the red sub-pixels R of the light-emitting area 120 and the first light-transmissive area 110a.

The second metal layer 130b can be disposed at a boundary between the white sub-pixels W of the light-emitting area 120 and the second light-transmissive area 110b.

The first metal layer 130a and the second metal layer 130b can be integrally formed with each other, for example, can be monolithic with each other. In other words, the second metal layer 130b can extend from the first metal layer 130a, or the first metal layer 130a can extend from the second metal layer 130b.

The third metal layer 130c and the fourth metal layer 130d can be disposed between sub-pixels adjacent to each other and rendering different colors.

The third metal layer 130c can be disposed between the red sub-pixel R and the white sub-pixel W of the light-emitting area 120.

The fourth metal layer 130d can be disposed between the blue sub-pixel B and the green sub-pixel G of the light-emitting area 120.

The third metal layer 130c and the fourth metal layer 130d can be integrally formed with each other, for example, can be monolithic with each other. In other words, the fourth metal layer 130d can extend from the third metal layer 130c, or the third metal layer 130c can extend from the fourth metal layer 130d.

The fifth metal layer 130e can be disposed between sub-pixels adjacent to each other and rendering different colors.

The fifth metal layer 130e can be disposed between the blue sub-pixel B and the red sub-pixel R adjacent to each other in the light-emitting area 120.

The fifth metal layer 130e can be disposed between the green sub-pixel G and the white sub-pixel W adjacent to each other in the light-emitting area 120.

The third metal layer 130c, the fourth metal layer 130d, and the fifth metal layer 130e can be integrally formed with each other, for example, can be monolithic with each other.

The third metal layer 130c, the fourth metal layer 130d and the fifth metal layer 130e can be formed so that the third metal layer 130c extends from the fifth metal layer 130e toward one side, and the fourth metal layer 130d extends from the fifth metal layer 130e toward the opposite side.

The first light-transmissive area 110a and the fourth light-transmissive area 110d can be disposed to face each other while the light-emitting area 120 is interposed therebetween.

The first light-transmissive area 110a can have a larger area size than an area size of the fourth light-transmissive area 110d.

The second light-transmissive area 110b and the third light-transmissive area 110c can be disposed to face each other while the light-emitting area 120 is interposed therebetween.

The second light-transmissive area 110b can have a larger area size than an area size of the third light-transmissive area 110c.

The first light-transmissive area 110a and the second light-transmissive area 110b can be arranged in a vertical direction and face each other while a virtual horizontal line is defined between the first light-transmissive area 110a and the second light-transmissive area 110b.

The third light-transmissive area 110c and the fourth light-transmissive area 110d can be arranged in the vertical direction and face each other while a virtual horizontal line is defined between the third light-transmissive area 110c and the fourth light-transmissive area 110d.

Figure 4:
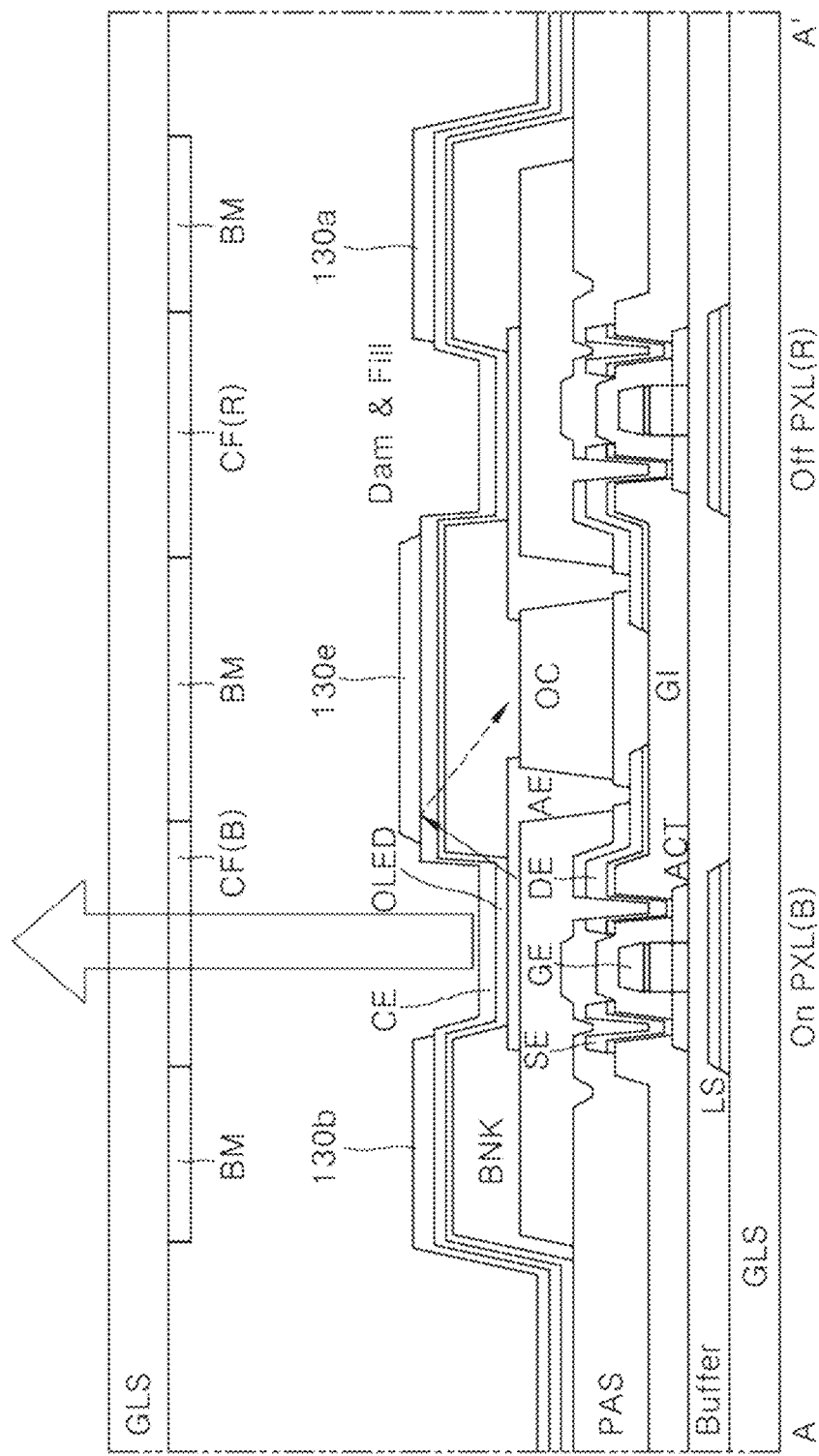
FIG. 4 is a cross-sectional view showing a cross section cut along an A-A' cut line in FIG. 3 in a display panel according to an embodiment of the present disclosure.

FIG. 4 is a cross-sectional view showing a cross section cut along an A-A' cut line in FIG. 3 in the display panel according to an embodiment of the present disclosure.

Referring to FIG. 4, in the display panel 100 according to an embodiment of the present disclosure, the light-emitting area 120 can include a blue sub-pixel On PXL(B) in an on state and a red sub-pixel Off PXL(R) in an off state.

In the light-emitting area 120, a light shielding layer LS is disposed on a first substrate GLS, and a buffer layer Buffer is disposed on the first substrate GLS and the light shielding layer LS.

An active layer ACT is disposed on the buffer layer Buffer, a first insulating layer is disposed on the active layer ACT, and a gate electrode GE is disposed on the first insulating layer. Both opposing side portions of the active layer ACT can respectively act as a source area and a drain area. The active layer ACT can include a first active layer corresponding to the source area, a second active layer corresponding to the gate electrode GE, and a third active layer corresponding to the drain area. For example, an area corresponding to the first active layer and on the buffer layer Buffer can act as a source electrode SE, and an area corresponding to the third active layer and on the buffer layer Buffer can act as a drain electrode DE. For example, according to characteristics of the active layer ACT, one area can be used as a source electrode or as a drain electrode and thus can act as a "source/drain electrode". Alternatively, depending on the characteristics of the active layer ACT, one area can be used as a source electrode, and the other area can be used as a drain electrode. Accordingly, naming of the electrode does not limit the present disclosure.

A gate insulating layer GI is disposed on the buffer layer Buffer, the active layer ACT, and the gate electrode GE. The source electrode SE and the drain electrode DE which are in contact with the active layer ACT via first through holes, respectively, are disposed on the gate insulating layer GI.

The source electrode SE and the drain electrode DE can be formed as follows. First, a source/drain electrode material layer is formed, and a photoresist PR is formed on the source/drain electrode material layer. Thereafter, a photoresist pattern is formed via an exposure and development process using a mask including a transmissive area and a blocking area. The source/drain electrode material layer is etched using the photoresist pattern as a mask. Thus, the source electrode SE and the drain electrode DE is formed.

The source/drain electrode material layer can be made of at least one of molybdenum (Mo), titanium (Ti), tantalum (Ta), tungsten (W), copper (Cu), chromium (Cr), aluminum (Al), and an alloy made of combinations thereof. Further, the source/drain electrode material layer can be made of a transparent conductive material such as (ITO) (Indium Tin Oxide). However, the present disclosure is not limited thereto. The source/drain electrode material layer can be made of a material that can be generally used for an electrode.

A passivation layer PAS is disposed on the source electrode SE and the drain electrode DE, and an overcoat layer OC is disposed on the passivation layer PAS.

An anode electrode AE connected to the drain electrode DE via a second through hole is disposed on the overcoat layer OC. A bank layer BNK and an organic light emitting layer OLED are disposed on the overcoat layer OC and the anode electrode AE.

The organic light emitting layer OLED can be formed using a thermal evaporation process using a shadow mask, or can be formed using a solution process such as an inkjet process. The organic light emitting layer OLED can include a hole injection layer, HIL, a hole transport layer HTL, a light emitting layer EML, an electron transport layer ETL, and an electron injection layer EIL. However, the present disclosure is not limited thereto.

The cathode electrode CE is disposed on the organic light-emitting layer OLED. Each of the alloy film or metal layers 130a, 130b, and 130e is disposed on the cathode electrode CE. A second insulating layer Dam & Fill is disposed on the alloy or metal layers 130a, 130b, and 130e.

A black matrix BM and a color filter layer CF are disposed on the second insulating layer Dam & Fill. A second substrate GLS is disposed on the black matrix BM and the color filter layer CF.

The anode electrode AE can be made of indium tin oxide (ITO), molybdenum (Mo), or indium tin oxide (ITO), and the cathode electrode CE can be made of indium zinc oxide (IZO).

The anode electrode AE can be made of indium tin oxide (ITO), indium zinc oxide (IZO), indium tin zinc oxide (ITZO), zinc oxide (ZO), or tin oxide (TO).

The cathode electrode CE can be made of at least one of magnesium (Mg), calcium (Ca), sodium (Na), titanium (Ti), indium (In), yttrium (Y), lithium (Li), aluminum (Al), silver (Ag), tin (Sn) and lead (Pb), or an alloy thereof.

The blue sub-pixel On PXL(B) includes the anode electrode AE, the organic light-emitting layer OLED and the cathode electrode CE. The gate electrode GE, the source electrode SE and the drain electrode DE constitute a thin-film transistor TFT.

In FIG. 4, when a scan signal is applied to the gate electrode GE and thus the thin-film transistor TFT is turned on, data power is applied from the source electrode SE to the drain electrode DE. The data power flows through the anode electrode AE in contact with the drain electrode DE and then through the organic light-emitting layer OLED and then to the cathode electrode CE.

When current flows through the organic light-emitting layer OLED, holes passing through the hole transport layer HTL and electrons passing through the electron transport layer ETL move to the organic light-emitting layer OLED and are combined with each other to generate excitons. As a result, the organic light-emitting layer OLED can emit visible light.

Figure 5:
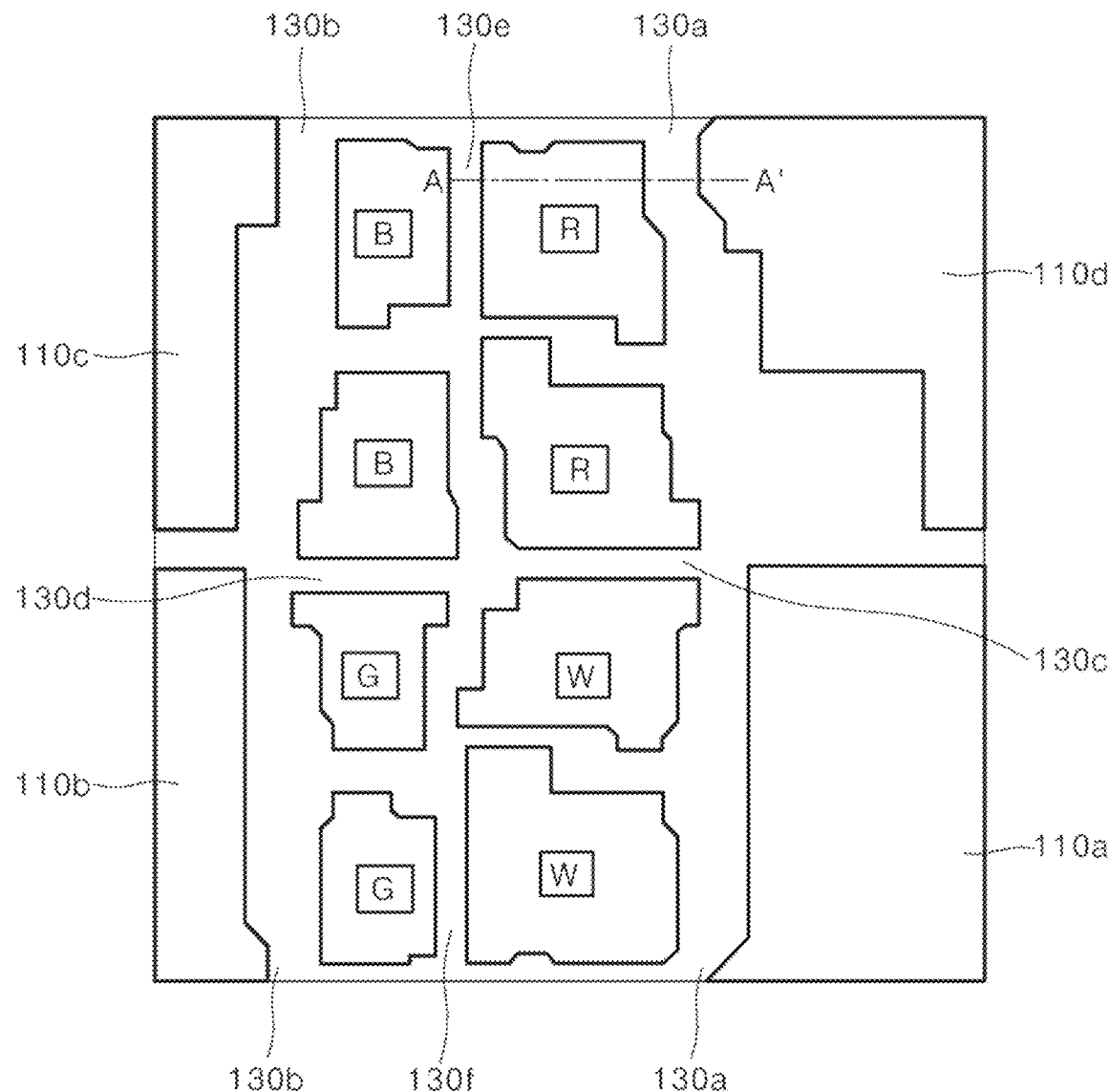
FIG. 5 is a view showing a plan view for cutting a light-transmissive area, a light-emitting area, and a metal layer in a display panel according to an embodiment of the present disclosure.
Figure 6:
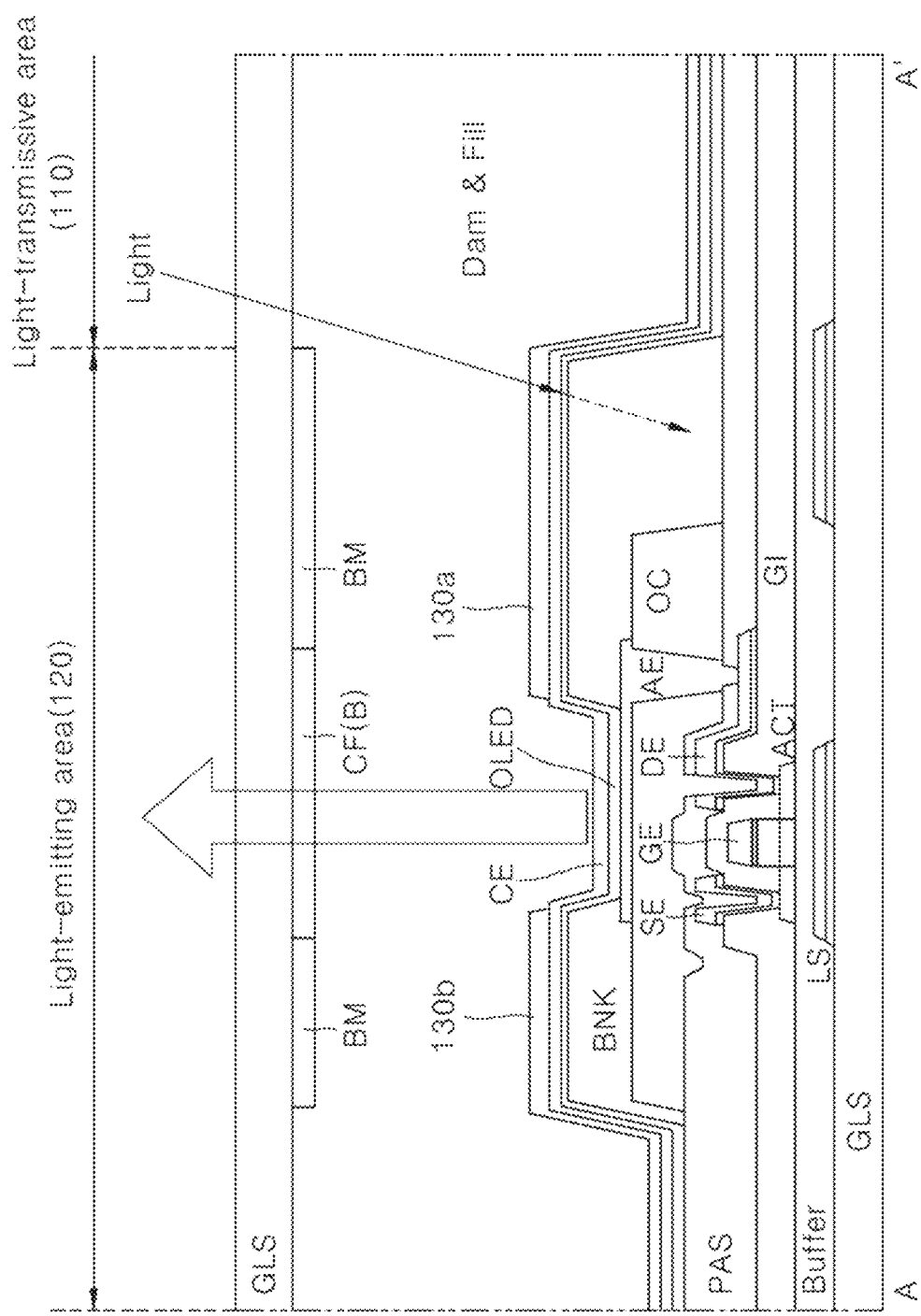
FIG. 6 is a cross-sectional view showing a cross-section taken along an A-A' cut line in FIG. 5 in a display panel according to an embodiment of the present disclosure.

FIG. 5 is a view showing a plan view for cutting a light-transmissive area, a light-emitting area and a metal layer in a display panel according to an embodiment of the present disclosure. FIG. 6 is a cross-sectional view showing a cross-section taken along an A-A' cut line in FIG. 5 in a display panel according to an embodiment of the present disclosure.

Referring to FIG. 5 and FIG. 6, a display panel 100 according to an embodiment of the present disclosure can include the light-transmissive area 110, the light-emitting area 120, and the metal layer 130.

The display panel 100 can include one unit pixel area, and one unit pixel area can include the light-transmissive area 110, the light-emitting area 120, and the metal layer 130.

The light-transmissive area 110 can include a plurality of light-transmissive areas 110a to 110d.

The light-emitting area 120 can include a plurality of sub-pixels R, G, B, and W.

The metal layer 130 can include a plurality of metal layers 130a to 130f.

The light-transmissive area 110 can include a first light-transmissive area 110a, a second light-transmissive area 110b, a third light-transmissive area 110c, and a fourth light-transmissive area 110d.

In FIG. 5, the first light-transmissive area 110a to the fourth light-transmissive area 110d respectively have the same structures as those of the first light-transmissive area 110a to the fourth light-transmissive area 110d shown in FIG. 3, and thus a description thereof will be omitted.

The light-emitting area 120 can include a plurality of red sub-pixels R, a plurality of green sub-pixels G, a plurality of blue sub-pixels B, and a plurality of white sub-pixels W. In FIG. 5, two red sub-pixels R can be arranged vertically and in an upper right portion of the light-emitting area 120, two blue sub-pixels B can be arranged vertically and in an upper left portion of the light-emitting area 120, two green sub-pixels G can be arranged vertically and in a lower left portion of the light-emitting area 120, and two white sub-pixels W can be arranged vertically and in a lower right portion of the light-emitting area 120.

The metal layer 130 can include a first metal layer 130a, a second metal layer 130b, a third metal layer 130c, a fourth metal layer 130d, a fifth metal layer 130e, and a sixth metal layer 130f.

In FIG. 5, the first metal layer 130a, the second metal layer 130b, the third metal layer 130c, the fourth metal layer 130d, and the fifth metal layer 130e respectively have the same arrangements and the same structures as those of the first metal layer 130a, the second metal layer 130b, and the third metal layer 130c, the fourth metal layer 130d and the fifth metal layer 130e shown in FIG. 3. Thus, a description thereof will be omitted.

The sixth metal layer 130f can be disposed at a boundary between one unit pixel area and another unit pixel area, for example, between adjacent unit pixel areas. For example, the sixth metal layer 130f is disposed at a boundary between the light-emitting area 120 of one unit pixel area and the light-emitting area 120 of another unit pixel area adjacent to each other in the vertical direction.

In FIG. 5, the cutting line A-A' cuts the fifth metal layer 130e, the red sub-pixel R, and the first metal layer 130a in the light-emitting area 120, and the first light-transmissive area 110a in the light-transmissive area 110.

Accordingly, FIG. 6 shows a cross-sectional structure of the light-emitting area 120 and the light-transmissive area 110 of the display panel 100.

In FIG. 6, the light-emitting area 120 has the same cross-sectional structure as that of the light-emitting area 120 shown in FIG. 4.

However, a difference between the cross-sectional structure of FIG. 6 and the cross-sectional structure of FIG. 4 is that a cross-sectional structure of the light-transmissive area 110 is added to the cross-sectional structure of FIG. 6.

Further, FIG. 6 shows that the first metal layer 130a is disposed on the cathode electrode CE and at the boundary between the light-emitting area 120 and the light-transmissive area 110.

In FIG. 6, the light-transmissive area 110 in a vertical range from the first substrate GLS to the cathode electrode CE has the same stack structure as that of the light-emitting area 120 in a vertical range from the first substrate GLS to the cathode electrode CE.

For example, in the light-transmissive area 110 in FIG. 6, the light shielding layer LS is disposed on the first substrate GLS, and the buffer layer Buffer is disposed on the first substrate GLS and the light shielding layer LS.

The active layer ACT is disposed on the buffer layer Buffer, the first insulating layer is disposed on the active layer ACT, and the gate electrode GE is disposed on the first insulating layer.

The gate insulating layer GI is disposed on the buffer layer Buffer, the active layer ACT, and the gate electrode GE. The source electrode SE and the drain electrode DE which are in contact with the active layer ACT via first through holes, respectively, are disposed on the gate insulating layer GI.

The passivation layer PAS is disposed on the source electrode SE and the drain electrode DE, and the overcoat layer OC is disposed on the passivation layer PAS.

The anode electrode AE connected to the drain electrode DE via the second through hole is disposed on the overcoat layer OC. The bank layer BNK and the organic light emitting layer OLED are disposed on the overcoat layer OC and the anode electrode AE.

The cathode electrode CE is disposed on the organic light-emitting layer OLED, and the second insulating layer Dam & Fill is disposed on the cathode electrode CE.

For example, in the light-transmissive area 110 in FIG. 6, the alloy or metal layers 130a and 130e are not disposed on the cathode electrode CE, but the second insulating layer Dam & Fill is disposed on the cathode electrode CE.

The light-emitting area 120 can include the light-emitting element composed of the anode electrode AE, the organic light-emitting layer OLED and the cathode electrode CE.

The cathode electrode CE can extend outwardly of the light-emitting area 120. The metal layer 130 can be disposed on the cathode electrode CE and at a boundary between the light-transmissive area 110 and the light-emitting area 120.

Further, in FIG. 6, in the light-transmissive area 110, the black matrix BM and the color filter layer CF are not disposed on the second insulating layer Dam & Fill. The second substrate GLS is disposed on the second insulating layer Dam & Fill.

In FIG. 6, each of the first substrate GLS, the buffer layer Buffer, the gate insulating layer GI, the second insulating layer Dam & Fill, the cathode electrode CE, and the second substrate GLS can be made of a transparent material that transmits light therethrough.

Accordingly, when the light-emitting area 120 is in an off state, natural light from an outside can be inputted into the light-transmissive area 110, so that the user can view the outside through the light-transmissive area 110.

Figure 7:
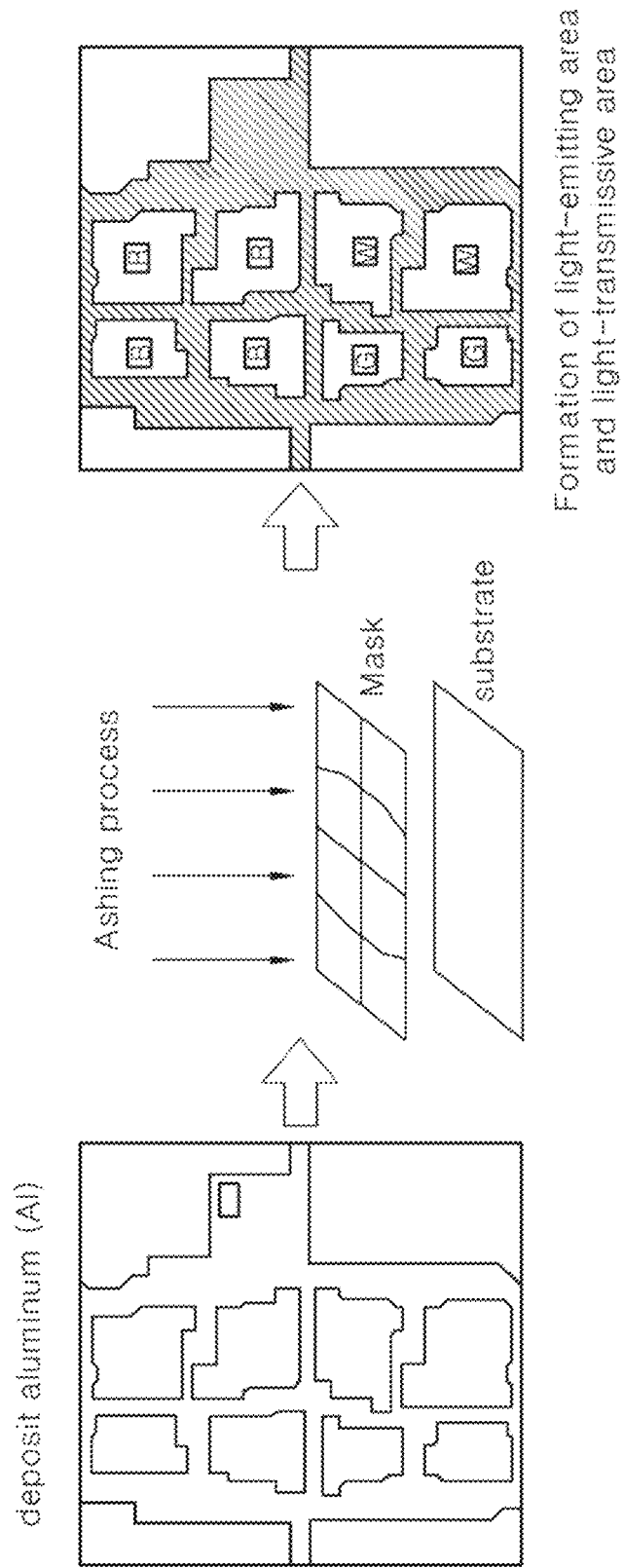
FIG. 7 is a diagram showing an example of a process for manufacturing a display panel according to an embodiment of the present disclosure.

FIG. 7 is a diagram showing an example of a process for manufacturing a display panel according to an embodiment of the present disclosure.

Referring to FIG. 7, a process for manufacturing the display panel 100 according to an embodiment of the present disclosure deposits aluminum (Al) on the first substrate GLS having a layout of the light-transmissive area 110 and the light-emitting area 120 as shown in FIG. 5.

Then, a metal mask is applied on the first substrate GLS on which the aluminum (Al) has been deposited.

In this regard, the metal mask has a metal pattern at a position thereof corresponding to a boundary between the light-transmissive area 110 and the light-emitting area 120.

Then, the aluminum (Al) in the light-emitting area 120 is removed from the first substrate GLS using the ashing process. Thus, the light-emitting area 120 and the light-transmissive area 110 are formed.

Therefore, aluminum (Al) is left only at a position of the first substrate GLS corresponding to the boundary between the light-transmissive area 110 and the light-emitting area 120 through the ashing process using a metal mask.

Figure 8:
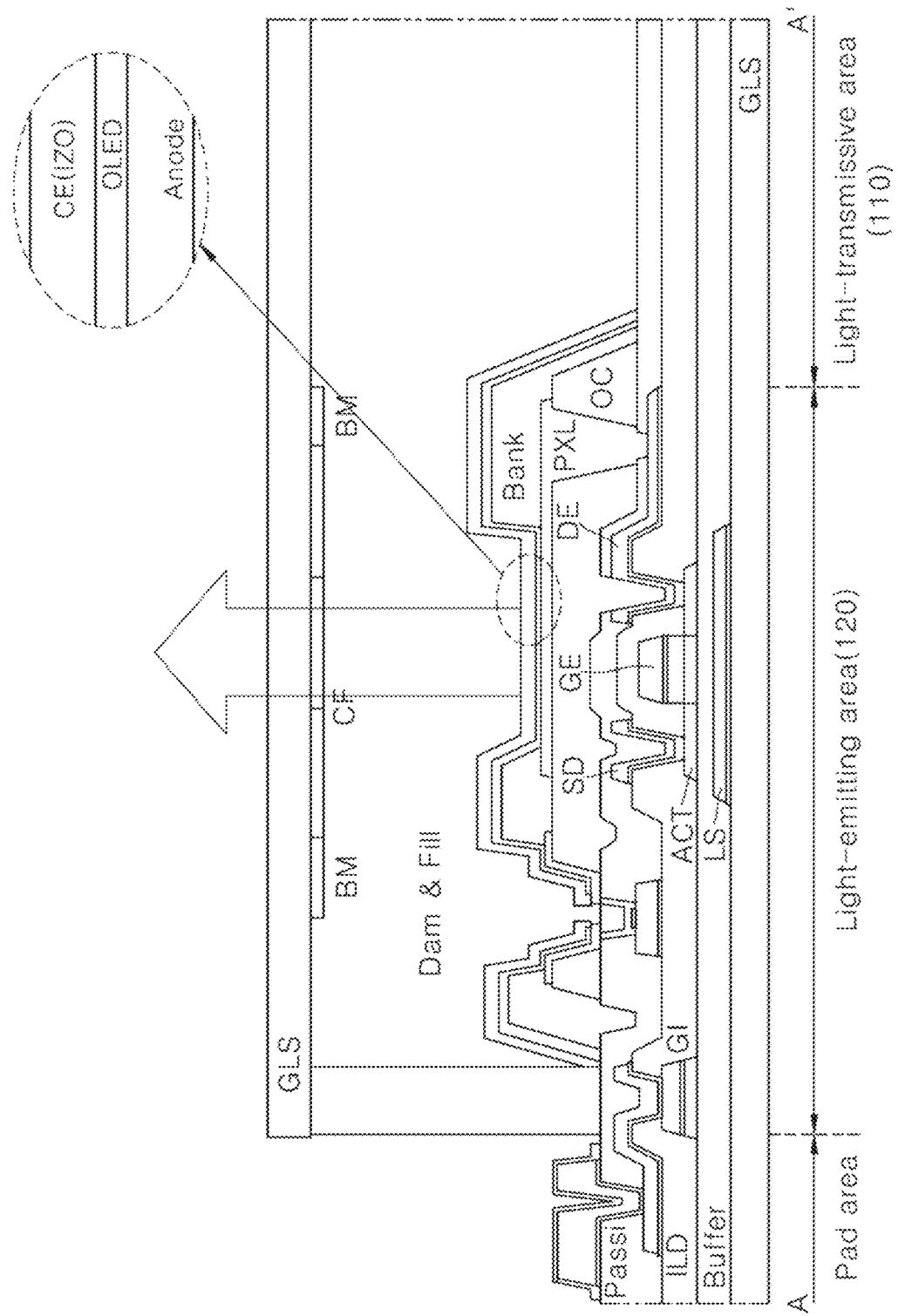
FIG. 8 is a diagram showing a stack structure of an organic light-emitting area in a cross-sectional view of a display panel according to an embodiment of the present disclosure.
Figure 9:
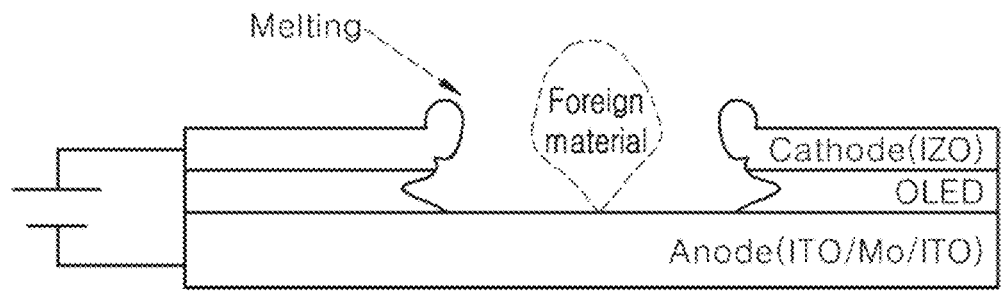
FIG. 9 is a diagram showing an example in which a foreign material is produced in a process of manufacturing an organic light-emitting area of FIG. 8.
Figure 10:
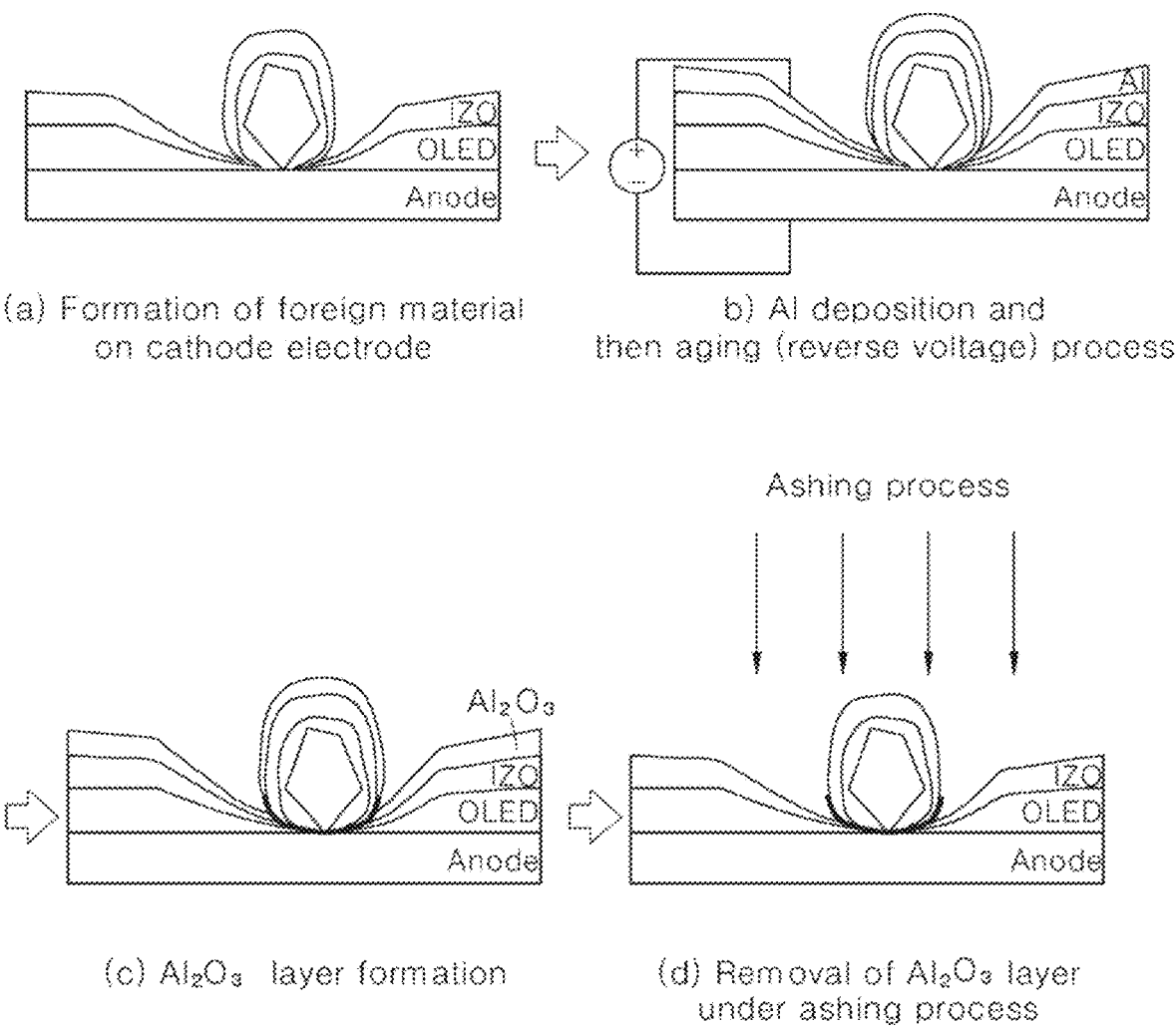
FIG. 10 is a diagram showing an example of electrically insulating the foreign material produced in an organic light-emitting area of FIG. 9 via an ashing process.

FIG. 8 is a diagram showing a stack structure of an organic light-emitting area in a cross-sectional view of a display panel according to an embodiment of the present disclosure. FIG. 9 is a diagram showing a case in which a foreign material is produced during a process for manufacturing the organic light-emitting area of FIG. 8. FIG. 10 is a diagram showing an example of electrically insulating the foreign material produced in the organic light-emitting area of FIG. 9 via an ashing process.

Referring to FIG. 8 to FIG. 10, in the light-emitting area 120 according to an embodiment of the present disclosure, the organic light-emitting layer OLED is disposed on the anode electrode AE, and the cathode electrode CE is disposed on the organic light-emitting layer OLED.

In this regard, the anode electrode AE can be made of indium tin oxide (ITO), molybdenum (Mo), or indium tin oxide (ITO), and the cathode electrode CE can be made of indium zinc oxide (IZO).

The organic light emitting layer OLED can be formed using a thermal evaporation process using a shadow mask, or can be formed using a solution process such as an inkjet process.

In this manufacturing process, when voltage applied to the anode electrode AE and the cathode electrode CE increases, the cathode electrode CE and the organic light-emitting layer OLED melt and thus a conductive foreign material can be produced on the anode electrode AE or the cathode electrode CE, as shown in FIG. 9.

The produced foreign material causes a short circuit between the anode electrode AE and the cathode electrode CE.

In an embodiment of the present disclosure, in order to prevent such a short circuit between the anode electrode AE and the cathode electrode CE, aluminum (Al) is deposited on the foreign material, and then the ashing process is performed, as shown in FIG. 10.

As shown in FIG. 10, the conductive foreign material is produced on the cathode electrode CE (a). Then, aluminum (Al) is deposited on the cathode electrode CE made of indium zinc oxide (IZO) and then a reverse voltage is applied thereto via an aging process (b).

Therefore, aluminum (Al) on the cathode electrode CE made of indium zinc oxide (IZO) is oxidized to produce an oxide layer ($Al_2O_3$) on the cathode electrode CE (c).

At this time, the aluminum (Al) between the foreign material and the cathode electrode CE is oxidized to form an oxide layer ($Al_2O_3$) on the cathode electrode CE. For example, the conductive foreign material and the cathode electrode CE can be electrically insulated from each other via the oxide layer.

Then, the ashing process is applied to the oxide layer ($Al_2O_3$) on the cathode electrode CE made of the indium zinc oxide (IZO) to remove the oxide layer ($Al_2O_3$) on the cathode electrode CE (d).

Accordingly, as the foreign material causing the short circuit between the anode electrode AE and the cathode electrode CE is electrically insulated from the cathode electrode, the short circuit between the anode electrode AE and the cathode electrode CE is prevented.

As described above, in accordance with the present disclosure, the foreign material is produced on the anode electrode AE, the organic light-emitting layer OLED is formed on the foreign material, the cathode electrode CE is formed on the organic light-emitting layer OLED, the metal layer (Al) is deposited on the cathode electrode CE, and the metal layer Al is converted into the metal oxide layer ($Al_2O_3$) under the aging process. In this manner, the metal oxide layer ($Al_2O_3$) is formed between the foreign material and the anode electrode AE.

Figure 11:
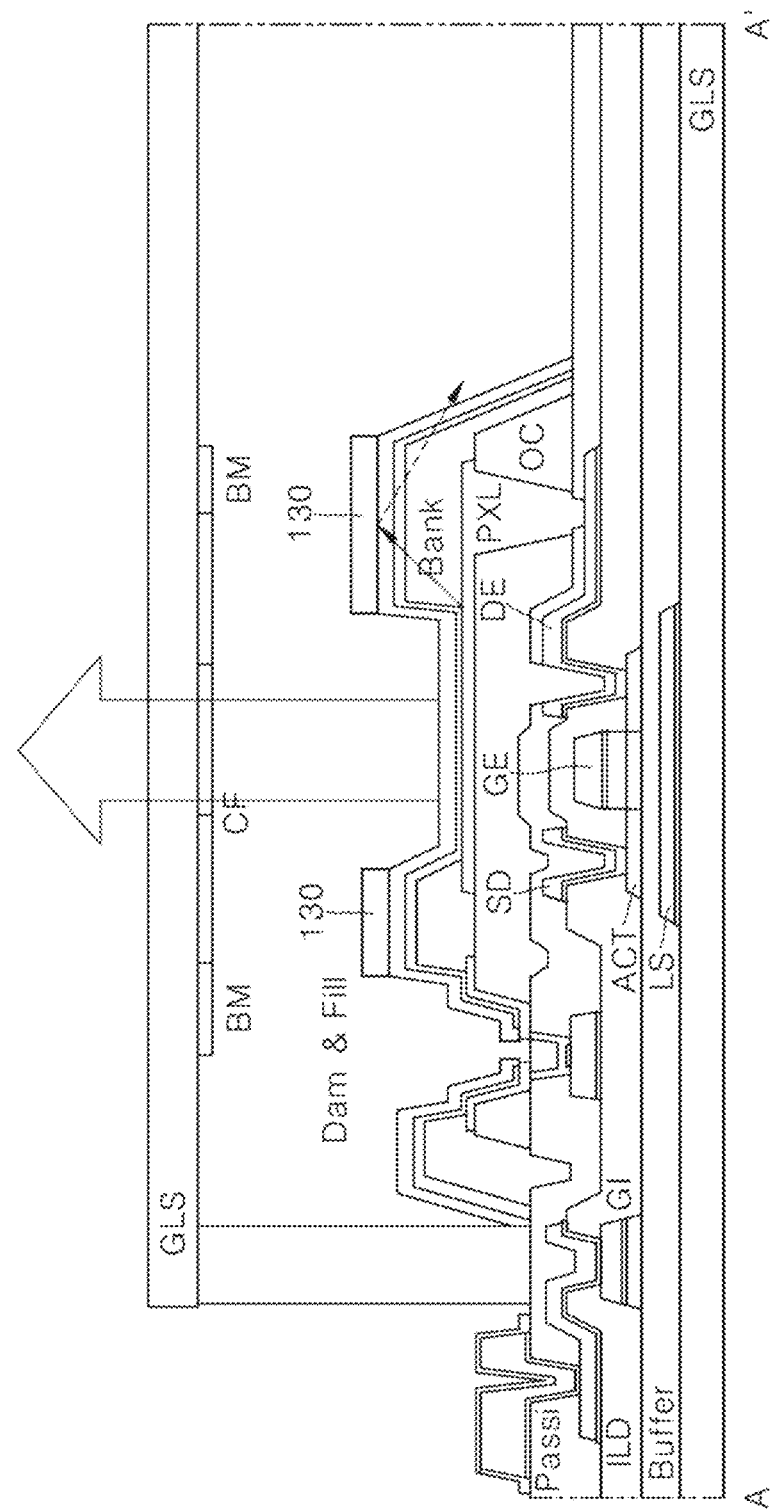
FIG. 11 is a diagram showing an example of preventing decrease in transmittance due to light leakage during light-emission of a light-emitting area according to an embodiment of the present disclosure.
Figure 12:
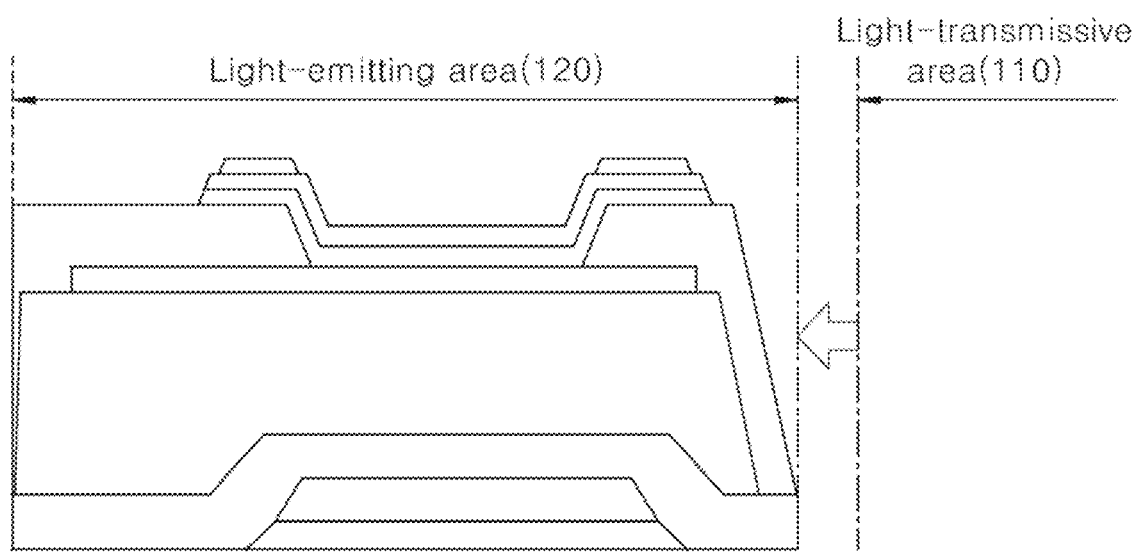
FIG. 12 is a diagram showing an example in which a light-transmissive area is further enlarged according to an embodiment of the present disclosure.

FIG. 11 is a diagram showing an example of preventing decrease in transmittance due to light leakage during light-emission of a light-emitting area according to an embodiment of the present disclosure. FIG. 12 is a diagram showing an example in which a light-transmissive area further extends according to an embodiment of the present disclosure.

Referring to FIG. 11, in the light-emitting area 120 according to an embodiment of the present disclosure, a driving thin-film transistor constituting one sub-pixel is turned on so that data power is applied from the source electrode SE to the drain electrode DE.

The data power flows through the anode electrode AE in contact with the drain electrode DE and then through the organic light-emitting layer OLED and then to the cathode electrode CE.

When current flows through the organic light-emitting layer OLED, holes passing through the hole transport layer HTL and electrons passing through the electron transport layer ETL move to the organic light-emitting layer OLED and are combined with each other to generate excitons. As a result, the organic light-emitting layer OLED can emit visible light.

In this regard, visible light emitted from the light-emitting area 120 is prevented from leaking into the light-transmissive area 110, due to the metal layer 130 formed at the boundary between the light-transmissive area 110 and the light-emitting area 120 as shown in FIG. 11.

For example, as shown in FIG. 11, in the light-emitting area 120, the visible light emitted from the organic light-emitting layer OLED collides with the metal layer 130 through the bank layer Bank and the cathode electrode CE and is reflected from the metal layer 130, and then travels back to the bank layer Bank and the cathode electrode CE.

Accordingly, the metal layer 130 can prevent the visible light emitted from the light-emitting area 120 from leaking to the light-transmissive area 110.

Referring to FIG. 12, in the light-emitting area 120 according to an embodiment of the present disclosure, aluminum (Al) is deposited on the cathode electrode, and then the oxide layer ($Al_2O_3$) is formed under the aging process and then a portion of the oxide layer ($Al_2O_3$) in the light-emitting area is removed via the ashing process. Thus, only aluminum (Al) remains at the boundary between the light-transmissive area 110 and the light-emitting area 120.

Accordingly, a boundary area between the light-emitting area 120 and the light-transmissive area 110 is shortened, and thus an area size of the light-transmissive area 110 increases. Therefore, the display panel 100 according to an embodiment of the present disclosure can implement a narrow bezel.

In one example, in an embodiment of the present disclosure, a display device 200 including the display panel 100 having the above configuration can be implemented.

Figure 13:
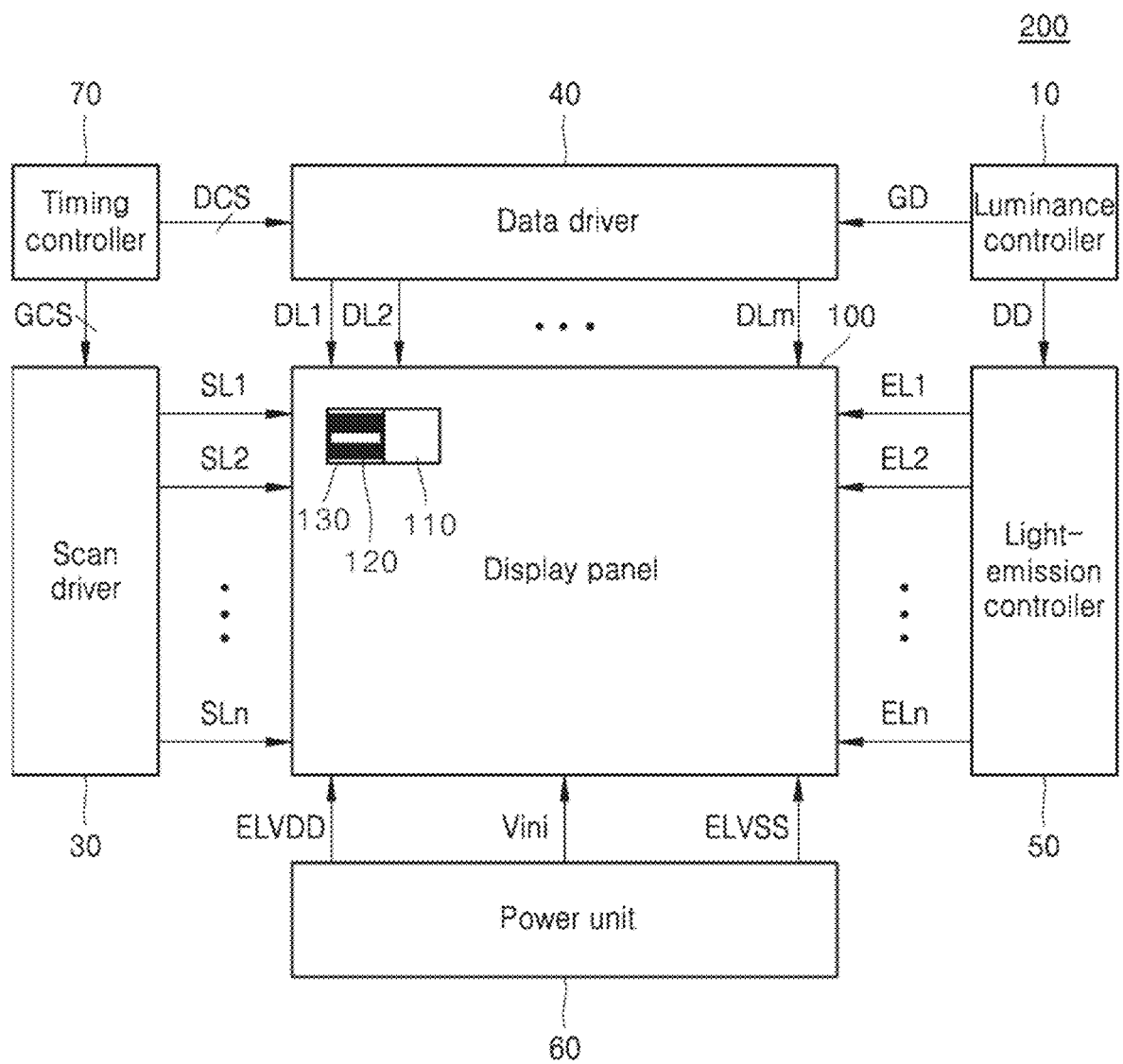
FIG. 13 is a diagram schematically showing a configuration of a display device including a display panel according to an embodiment of the present disclosure.

FIG. 13 is a diagram schematically showing a configuration of a display device including a display panel according to an embodiment of the present disclosure.

Referring to FIG. 13, the display device 200 according to an embodiment of the present disclosure includes the display panel 100 having the structure shown in FIG. 1 as described above.

The display panel 100 according to an embodiment of the present disclosure includes one unit pixel area, and one unit pixel area includes the light-transmissive area 110, the light-emitting area 120, and the metal layer 130.

In this regard, since the light-transmissive area 110, the light-emitting area 120, and the metal layer 130 respectively have the same structures as those shown in FIG. 1, detailed descriptions thereof will be omitted.

The display device 200 according to an embodiment of the present disclosure can include the above-described display panel 100, a luminance controller 10, a scan driver 30, a data driver 40, a light-emission controller 50, a power unit 60 and a timing controller 70, etc.

Accordingly, since the display device 200 according to an embodiment of the present disclosure includes the above-described display panel 100 having the metal layer at the boundary between the light-transmissive area 110 and the light-emitting area 120, the dark spot defect in the light-transmissive area may not occur, and mixing between colors of adjacent pixels can be prevented. Further, the short circuit between the anode electrode and the cathode electrode in the organic light-emitting area as caused by the foreign material can be prevented. Further, decrease in transmittance due to light leakage can be prevented due to the metal layer at the boundary therebetween.

Accordingly, the display device 200 according to an embodiment of the present disclosure can implement a large area, high resolution, and narrow bezel.

The scan driver 30 can be implemented as, for example, GIP or AAGIP.

The luminance controller 10 can provide one gamma set selected from a plurality of gamma sets each including a plurality of gamma data to the data driver 40, and provide dimming data corresponding to the selected gamma set to the light-emission controller 50.

The display panel 100 can include a display area AA and a non-display area NA.

In the display area AA, a plurality of scan lines SL respectively disposed in rows and a plurality of data lines DL respectively disposed in columns can intersect each other, and each pixel can be disposed at each intersection therebetween. Each pixel can include at least one sub-pixel R, G, B, etc. Accordingly, at least one sub-pixel can be disposed at each intersection.

For example, the display panel 100 can include an organic substrate or a plastic substrate, and a plurality of scan lines SL and a plurality of data lines DL, and red, green, and blue sub-pixels R, G, and B at the intersections between the scan lines SL and the data line DL, on the organic substrate or the plastic substrate. One pixel including one or more sub-pixels R, G, B, W, etc. can be referred to as a 'unit pixel'.

In this regard, each of the sub-pixels can include an organic electroluminescent diode OLED. The organic electroluminescent diode OLED can be implemented was the organic light-emitting layer OLED as shown in FIG. 1 to FIG. 12. Each of the plurality of scan lines SL can be disposed in each of rows of the plurality of sub-pixels, while each of the plurality of data lines DL can be disposed in each of columns of the plurality of sub-pixels. Accordingly, the plurality of sub-pixels can include the plurality of light-emitting diodes OLED arranged in rows and columns.

The scan and data lines SL and DL of the display panel 100 can be respectively connected to a GIP unit disposed in the display area AA and the data driver formed out of the display panel 100. Further, the power voltage supply lines ELVDD, Vini, and ELVSS extending in a direction parallel to the data line DL can be further formed in the display panel 100 and can be connected to each of the pixels.

Further, each pixel can include at least one organic electroluminescent diode OLED, a storage capacitor, switching thin-film transistors and a driving thin-film transistor. In this regard, the organic electroluminescent diode OLED can include a first electrode (hole injection electrode), an organic compound layer, and a second electrode (electron injection electrode). The first electrode can be the anode electrode AE, the second electrode can be the cathode electrode CE, and the organic compound layer can be the organic light-emitting layer OLED.

The organic compound layer can include a light-emitting layer in which light is actually emitted, and can further include various organic layers for efficiently transferring carriers including holes or electrons to the light-emitting layer. These organic layers can include a hole injection layer and a hole transport layer positioned between the first electrode and the light-emitting layer, and an electron injection layer and an electron transport layer positioned between the second electrode and the light-emitting layer.

Further, the switching and driving thin-film transistors can be connected to the scan line SL and the control signal supply line EL and the data line DL. The switching thin-film transistors can be turned on based on a gate voltage input to the scan line SL, and thus can transmit a data voltage input to the data line DL to the driving thin-film transistor. The storage capacitor can be connected to and disposed between the thin-film transistor and the power supply line, can be charged with the data voltage transmitted from the thin-film transistor, and the charged state thereof can be maintained for 1 frame.

Moreover, the driving thin-film transistor can be connected to the power supply line and the storage capacitor and can supply a drain current corresponding to a voltage difference between voltages of the gate electrode and the source electrode thereof to the organic electroluminescent diode OLED. Accordingly, the organic electroluminescent diode OLED emits light based on the drain current. In this regard, the driving thin-film transistor includes a gate electrode, a source electrode and a drain electrode, and an anode electrode of the organic electroluminescent diode OLED can be connected to one electrode of the driving thin-film transistor.

The scan driver 30 can apply a scan signal to the plurality of scan lines SL. For example, the scan driver 30 can sequentially apply a gate voltage to the pixels on one horizontal line basis in response to a gate control signal GCS. The scan driver 30 can be implemented as a shift register having a plurality of stages that sequentially output a high-level gate voltage every 1 horizontal (1H) period.

The data driver 40 can apply a data signal to the plurality of data lines DL. For example, the data driver 40 receives an image signal of a digital waveform applied from the timing controller 70, converts the image signal into a data voltage as an analog voltage having a gray level value that each sub-pixel can process, and then supplies the data voltage to each sub-pixel via the data lines DL in response to a data control signal DCS input thereto. In this regard, the data driver 40 can convert the image signal into the data voltage based on multiple reference voltages supplied from a reference voltage supplier.

Further, when the data driver 40 receives one gamma set selected from the luminance controller 10, the data driver 40 can provide the low-potential voltage ELVSS and the initialization voltage Vini corresponding to the one selected gamma set based on a look-up table to the display panel 100.

The light-emission controller 50 can apply a light-emitting control signal EL to the plurality of pixels.

The power unit 60 can provide the high-potential voltage ELVDD, the low-potential voltage ELVSS, a reference voltage, and the initialization voltage Vini to each pixel.

The timing controller 70 can control the scan driver 30 and the data driver 40. For example, the timing controller 70 receives an image signal, a clock signal, and timing signals such as vertical and horizontal synchronization signals from an external system, generates the gate control signal GCS and the data control signal DCS, based on the received signals, and provides respectively the gate control signal GCS and the data control signal DCS to the scan driver 30 and the data driver 40.

In this regard, the horizontal synchronization signal indicates a time it takes to display one line of a screen, and the vertical synchronization signal indicates a time it takes to display a screen of one frame. Further, the clock signal refers to a signal on which control signals of a gate and each of the drivers are generated based.

In one example, the timing controller 70 can be connected to an external system via a predetermined interface and can receive an image-related signal and a timing signal output therefrom at high speed without noise. The interface can include a LVDS (Low Voltage Differential Signal) scheme interface or a TTL (Transistor-Transistor Logic) scheme interface.

Further, the timing controller 70 according to an embodiment of the present disclosure can have an embedded microchip therein including a compensation model that generates a compensation value for a data voltage based on current deviation of each pixel. Thus, the timing controller can apply the voltage compensation value to the image signal to be provided to the data driver. Thus, the voltage compensation value has been reflected in the data voltage supplied from the data driver.

The present disclosure can be applied to an organic light-emitting display device operating in a bottom-emission scheme. However, the disclosure is not limited thereto. The present disclosure can be applied to an organic light-emitting display device which operates in a top-emission or dual-emission scheme, when necessary.

Each light-emitting area 120 can include at least one sub-pixel.

Each of at least one sub-pixel R, G, B, and W can include a switching TFT, a driving TFT, a variable storage capacitor, and a fixed capacitor.

The switching TFT can switch a data voltage path from the data line in response to the scan signal input through the gate line.

The driving TFT can be turned on based on a magnitude of data voltage from the switching TFT to control an amount of light emitted from the organic light-emitting diode OLED.

The variable storage capacitor can be connected to the gate electrode of the driving TFT and in parallel with the driving TFT. Thus, a capacitance of the variable storage capacitor can vary based on a magnitude of a voltage applied to the gate electrode of the driving TFT.

The fixed capacitor can have a smaller fixed capacitance than a variable capacitance of the variable storage capacitor and can be connected in parallel to the variable storage capacitor.

The fixed capacitor can be composed of a gate electrode of the driving TFT, a gate insulating layer thereof, and a conductive electrode layer overlapping with at least a partial area of the gate electrode of the driving TFT while the gate insulating layer is interposed between the gate electrode and the conductive electrode layer. The conductive electrode layer can be electrically connected to a high-potential or low-potential voltage supply terminal.

As described above, according to the present disclosure, in a large-area display having the display area composed of the light-emitting area and the light-transmissive area, the dark spot defect in the light-transmissive area can be reduced, the decrease in transmittance due to light leakage can be prevented, and mixing between colors of adjacent pixels can be prevented.

Moreover, according to the present disclosure, the display device can be realized in which the metal layer is disposed at the boundary between the light-emitting area and the light-transmissive area in the display area and at the boundary between the two adjacent light-transmissive areas, thereby preventing the dark spot defect in the light-transmissive area and preventing mixing between colors of adjacent pixels.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure.

The scope of the technical idea of the present disclosure is not limited by the embodiments.

Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display panel comprising:
at least two light-transmissive areas through which light is transmitted; and
at least one light-emitting area disposed between two adjacent light-transmissive areas among the at least two light-transmissive areas,
wherein at least one metal layer is disposed at a boundary between the at least two light-transmissive area and the at least one light-emitting area adjacent to each other, and encircles the at least one light-emitting area,
wherein the at least one metal layer is disposed on a cathode electrode, and
wherein each of at least one sub-pixel of the at least one light-emitting area includes:
a first substrate;
a light shielding layer disposed on the first substrate;
a buffer layer disposed on the first substrate and the light shielding layer;
an active layer disposed on the buffer layer;
a first insulating layer disposed on the active layer;
a gate electrode disposed on the first insulating layer;
a gate insulating layer disposed on the buffer layer, the active layer, and the gate electrode;
a source electrode and a drain electrode disposed on the gate insulating layer and respectively electrically connected to the active layer via first through holes;
a passivation layer disposed on the source electrode and the drain electrode;
an overcoat layer disposed on the passivation layer;
an anode electrode disposed on the overcoat layer and electrically connected to the drain electrode via a second through hole;
a bank layer and an organic light-emitting layer disposed on the anode electrode; and
the cathode electrode disposed on the organic light-emitting layer.

2. The display panel of claim 1, wherein one light-emitting area among the at least one light-emitting area includes a light-emitting element,
wherein the light-emitting element includes an anode electrode, an organic light-emitting layer and the cathode electrode,
wherein the cathode electrode extends outwardly of the one light-emitting area, and
wherein one metal layer among the at least one metal layer is disposed on a portion of the cathode electrode at the boundary between one light-transmissive area among the at least two light-transmissive areas and the one light-emitting area.

3. The display panel of claim 1, wherein the at least one metal layer is disposed at a boundary between two light-transmissive areas adjacent to each other.

4. The display panel of claim 3, wherein the at least one metal layer is disposed at a boundary between two light-emitting areas adjacent to each other.

5. The display panel of claim 1, wherein the at least one metal layer is made of aluminum or is made of an alloy including aluminum.

6. The display panel of claim 5, wherein the alloy includes one selected from a group consisting of an alloy material of aluminum and titanium, an alloy material of aluminum and molybdenum, and an alloy material of aluminum and indium zinc oxide.

7. The display panel of claim 1, wherein one light-emitting area among the at least one light-emitting area includes a plurality of sub-pixels rendering different colors and a plurality of sub-pixels rendering a same color.

8. The display panel of claim 7, wherein the at least one metal layer is disposed at a boundary between two adjacent sub-pixels rendering different colors and is not disposed at a boundary between two adjacent sub-pixels rendering a same color.

9. The display panel of claim 7, wherein the sub-pixels include a red sub-pixel, a green sub-pixel, a blue sub-pixel and a white sub-pixel,
wherein the one light-emitting area includes a light-emitting element, and the light-emitting element includes an anode electrode, an organic light-emitting layer and a cathode electrode, and
wherein each of the anode electrode, the organic light-emitting layer and the cathode electrode is made of a transparent material.

10. The display panel of claim 1, wherein the at least one light-emitting area emits light when power is applied thereto, and
wherein when the power of the at least one light-emitting area is turned off, natural light transmits through the at least two light-transmissive areas so that a look of nature is visible.

11. The display device of claim 1, wherein each of the at least one sub-pixel further includes:
a second insulating layer disposed on the at least one metal layer;
a black matrix and a color filter layer disposed on the second insulating layer; and
a second substrate disposed on the black matrix and the color filter layer.

12. The display device of claim 1, wherein the anode electrode is formed of indium tin oxide, molybdenum, or indium zinc oxide, and
wherein the cathode electrode is made of indium zinc oxide.

13. The display device of claim 1, wherein the anode electrode is formed of indium tin oxide, indium zinc oxide, indium tin zinc oxide, zinc oxide, or tin oxide.

14. The display device of claim 1, wherein the cathode electrode is made of at least one selected from a group consisting of magnesium, calcium, sodium, titanium, indium, yttrium, lithium, aluminum, silver, tin, lead, or an alloy thereof.

15. The display device of claim 1, wherein a foreign material is formed on the anode electrode,
wherein the organic light-emitting layer is formed on the foreign material, and
wherein when the at least one metal layer is deposited on the cathode electrode, the at least one metal layer is converted into a metal oxide layer using an aging process, so that the metal oxide layer is formed between the foreign material and the anode electrode.

16. The display panel of claim 1, further comprising:
a foreign material located on the at least one light-emitting area; and a metal oxide layer disposed on the at least one light-emitting area, and in contact with the foreign material.

17. A display device comprising:
a display panel including:
   at least two light-transmissive areas through which light is transmitted; and
   at least one light-emitting area disposed between two adjacent light-transmissive areas among the at least two light-transmissive areas,
wherein at least one metal layer is disposed at a boundary between the at least two light-transmissive areas and the at least one light-emitting area adjacent to each other, and encircles the at least one light-emitting area;
a data driver configured to apply a data signal to the at least one light-emitting area;
a scan driver configured to apply a scan signal to the at least one light-emitting area; and
a timing controller configured to control the data driver and the scan driver,
wherein the at least one metal layer is disposed on a cathode electrode, and
wherein each of at least one sub-pixel of the at least one light-emitting area includes:
   a first substrate;
   a light shielding layer disposed on the first substrate;
   a buffer layer disposed on the first substrate and the light shielding layer;
   an active layer disposed on the buffer layer;
   a first insulating layer disposed on the active layer;
   a gate electrode disposed on the first insulating layer;
   a gate insulating layer disposed on the buffer layer, the active layer, and the gate electrode;
   a source electrode and a drain electrode disposed on the gate insulating layer and respectively electrically connected to the active layer via first through holes;
   a passivation layer disposed on the source electrode and the drain electrode;
   an overcoat layer disposed on the passivation layer;
   an anode electrode disposed on the overcoat layer and electrically connected to the drain electrode via a second through hole;
   a bank layer and an organic light-emitting layer disposed on the anode electrode; and
   the cathode electrode disposed on the organic light-emitting layer.

18. The display device of claim 17,
wherein each of the at least one sub-pixel further includes:
a switching thin film transistor (TFT) for switching a data voltage path from a data line in response to a scan signal input through a gate line;
a driving TFT turned on based on a magnitude of data voltage from the switching TFT to control an amount of light emitted from an organic light-emitting diode;
a variable storage capacitor connected to a gate electrode of the driving TFT and in parallel with the driving TFT, wherein a capacitance of the variable storage capacitor varies based on a magnitude of voltage applied to the gate electrode of the driving TFT; and
a fixed capacitor having a smaller fixed capacitance than the capacitance of the variable storage capacitor, wherein the fixed capacitor is connected in parallel with the variable storage capacitor.

19. The display device of claim 18, wherein the fixed capacitor includes:
the gate electrode of the driving TFT;
a gate insulating layer of the driving TFT; and
a conductive electrode layer overlapping with at least a partial area of the gate electrode of the driving TFT, wherein the gate insulating layer thereof is interposed between the gate electrode and the conductive electrode layer,
wherein the conductive electrode layer is electrically connected to a high-potential or low-potential voltage supply terminal.

* * * * *